United States Patent
Thinakaran

(10) Patent No.: US 10,951,227 B1
(45) Date of Patent: Mar. 16, 2021

(54) MULTIPLYING DIGITAL TO ANALOG CONVERTER WITH INCREASED MULTIPLYING BANDWIDTH

(71) Applicant: TEXAS INSTRUMENTS INCORPORATED, Dallas, TX (US)

(72) Inventor: Rajavelu Thinakaran, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/724,817

(22) Filed: Dec. 23, 2019

(51) Int. Cl.
  *H03M 1/78* (2006.01)
  *H03M 1/06* (2006.01)
  *H03M 1/66* (2006.01)

(52) U.S. Cl.
  CPC .............. *H03M 1/785* (2013.01); *H03M 1/06* (2013.01); *H03M 1/66* (2013.01); *H03M 1/78* (2013.01)

(58) Field of Classification Search
  CPC .......... H03M 1/785; H03M 1/66; H03M 1/06; H03M 1/78
  USPC ................................................ 341/144, 154
  See application file for complete search history.

(56) References Cited

U.S. PATENT DOCUMENTS

| | | | |
|---|---|---|---|
| 8,217,819 B2* | 7/2012 | Chang | H03M 1/0653 341/150 |
| 9,112,523 B1* | 8/2015 | Ford | H03M 1/0609 |
| 10,312,925 B1* | 6/2019 | Chen | H03M 1/164 |

* cited by examiner

Primary Examiner — Brian K Young
(74) Attorney, Agent, or Firm — John R. Pessetto; Charles A. Brill; Frank D. Cimino

(57) ABSTRACT

A multiplying digital to analog converter (MDAC) includes a first resistor configured to be selectively connected to a current output node based on a first bit of a first portion of an input digital code and a second resistor configured to be selectively connected to the current output node based on a second bit of the first portion of the input digital code. A resistance of the second resistor is a resistance of the first resistor scaled by a factor. The MDAC further includes a first capacitor configured to be selectively connected to the current output node based on the first bit of the first portion and a second capacitor configured to be selectively connected to the current output node based on the second bit of the first portion. A capacitance of the second capacitor is a capacitance of the first capacitor scaled by an inverse of the factor.

20 Claims, 2 Drawing Sheets

MULTIPLYING DIGITAL TO ANALOG CONVERTER WITH INCREASED MULTIPLYING BANDWIDTH

BACKGROUND

Digital to analog converters (DACs) are common components of many electronic devices. A DAC receives an input digital code and outputs an analog signal based on the code. One type of DAC in use today is a multiplying DAC (MDAC). An MDAC uses a resistor ladder to weight a contribution of each bit of the input code to an output current based on an order of the bit. Due to the resistor ladder, higher order bits of the code affect the output current more than lower order bits. Such MDACs often include or are connected to an operational amplifier to convert the output current into an output voltage. A relationship between the output voltage ($V_{OUT}$) and input code (code) in an N-bit DAC may be expressed as $$V_{OUT} = V_{REF} * \frac{code}{2^N},$$

where $V_{REF}$ corresponds to a reference voltage received by the DAC.

A common application of MDAC is as a variable attenuator where the input signal is connected to the reference input of the DAC and the DAC code is used to set the attenuation factor. In such applications, multiplying bandwidth is defined as the frequency at which the DAC gain from reference input to OPAMP output reduces to −3 dB below the DAC gain at DC. Multiplying bandwidth is a function of the OPAMP bandwidth and the parasitic capacitance generated by the resistor ladder. In particular, switches included in such resistor ladders generate high parasitic capacitance. In addition, there is further parasitic capacitance due to board trace and amplifier input capacitance. This parasitic capacitance degrades the stability of the OPAMP and may introduce a peak into a pass band response of a DAC and therefore limit a multiplying bandwidth of the DAC.

SUMMARY

A multiplying digital to analog converter (MDAC) is disclosed that includes an array of capacitors scaled in inverse proportion to resistors in the MDAC. Each capacitor in the array of capacitors is selectively coupled to an output current node based on the portion of MDAC code used to selectively couple a corresponding resistor to the output current node. This arrangement alters a transfer function of the MDAC such that multiplying bandwidth of the MDAC may be increased without increasing power dissipation of the MDAC.

BRIEF DESCRIPTION OF THE DRAWINGS

For a detailed description of various examples, reference will now be made to the accompanying drawings in which.

DETAILED DESCRIPTION

Figure 1:
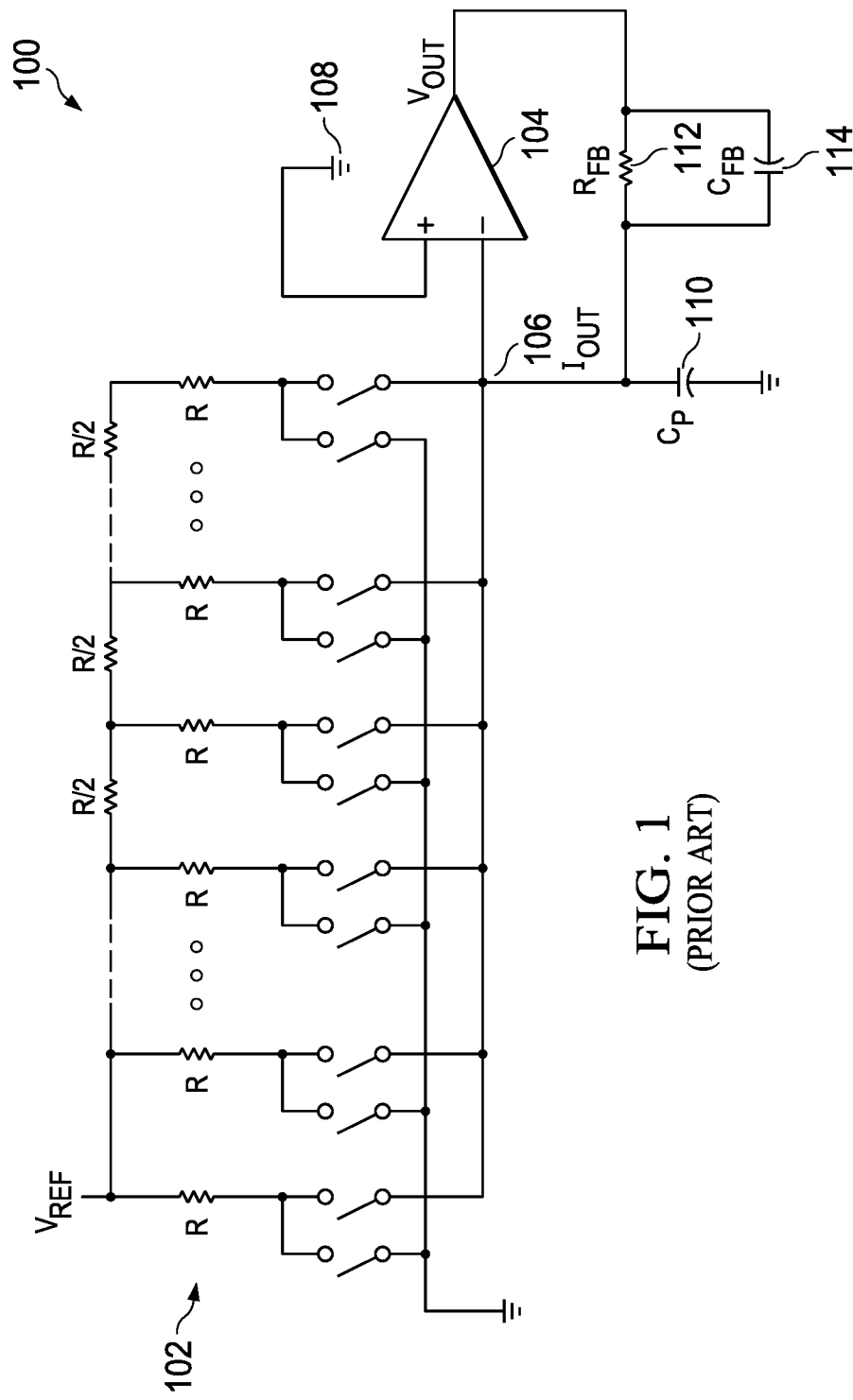
FIG. 1 illustrates a prior art multiplying digital to analog converter (MDAC).

Referring to FIG. 1, a prior art multiplying digital to analog converter (MDAC) 100 is shown. As illustrated, the prior art MDAC 100 includes a resistor section 102 configured to generate an DAC resistance at a current output node 106 based on an input digital code. The current output node 106 is connected to a first terminal of an operational amplifier (OPAMP) 104. A parasitic capacitance 110 is shown coupled to the first terminal of the OPAMP 104. This parasitic capacitance 110 is primarily generated by switches in the resistor section 102 but also due to the board trace, OPAMP input capacitance etc. In the illustrated example, a second terminal of the OPAMP 104 is connected to ground 108; in other implementations, the second terminal of the OPAMP 104 is connected to a non-zero voltage. Accordingly, the OPAMP 104 is configured to output a voltage based on a resistance at the current output node 106. A feedback resistor 112 is connected to an output of the OPAMP 104 and to the current output node 106 establishing a feedback loop. The MDAC 100 includes a feedback capacitor 114 connected across the feedback resistor 112. The feedback capacitor 114 is used to improve the stability of the OPAMP 104 in the presence of parasitic capacitance 110 and achieve a flat passband response.

A Laplace transfer function of the MDAC 100 at full digital input code is given by $$\frac{V_{OUT}}{V_{REF}} = \frac{1}{\frac{s^2 R_{FB}(C_{FB} + C_P)}{\omega_{UGB}} + s\left(\frac{2}{\omega_{UGB}} + R_{FB}C_{FB}\right) + 1},$$

where $V_{OUT}$ corresponds to an output voltage of the OPAMP 104, $V_{REF}$ corresponds to an reference voltage received by the resistor section 102, s corresponds to Laplace transform complex frequency, $R_{FB}$ corresponds to a resistance of the feedback resistor 112, $C_P$ corresponds to the parasitic capacitance 110, and $\omega_{UGB}$ corresponds to a unity gain bandwidth of the OPAMP 104 in rad/s. This second order transfer function may be simplified by assuming $$R_{FB}C_{FB} \gg \frac{2}{\omega_{UGB}}$$

resulting in a function of $$\omega_n = \sqrt{\frac{\omega_{UGB}}{R_{FB}(C_{FB} + C_P)}},$$

where $\omega_n$ is the natural frequency of the second order system and is approximately equal to the multiplying bandwidth of the MDAC 100. A damping factor, $\zeta$ is equal to $$\sqrt{\frac{R_{FB}C_{FB}\omega_{UGB}}{4\left(1 + \frac{C_P}{C_{FB}}\right)}}.$$

Selecting a damping factor of 0.7 for a flat passband response yields $$\omega_n = \frac{\sqrt{2}}{R_{FB}C_{FB}}.$$

The multiplying bandwidth of the MDAC 100 can be increased by reducing $R_{FB}$ or $C_{FB}$, but it is important to keep the damping factor equal to 0.7 to achieve a flat passband response. Accordingly, the multiplying bandwidth of the MDAC 100 may be doubled by halving $R_{FB}$ of the feedback resistor 112 and doubling the $\omega_{UGB}$ of the OPAMP 104 or by multiplying $R_{FB}$ by ¼ and doubling $C_{FB}$ of the feedback capacitor 114. However, halving $R_{FB}$ of the feedback resistor 112 and doubling the $\omega_{UGB}$ of the OPAMP 104 will double a power dissipation of the MDAC 100, double an area of the MDAC 100, and increase power of the OPAMP 104. Further, multiplying $R_{FB}$ by ¼ and doubling $C_{FB}$ of the feedback capacitor 114 will quadruple power dissipation and increase area of the MDAC 100 by four times.

Figure 2:
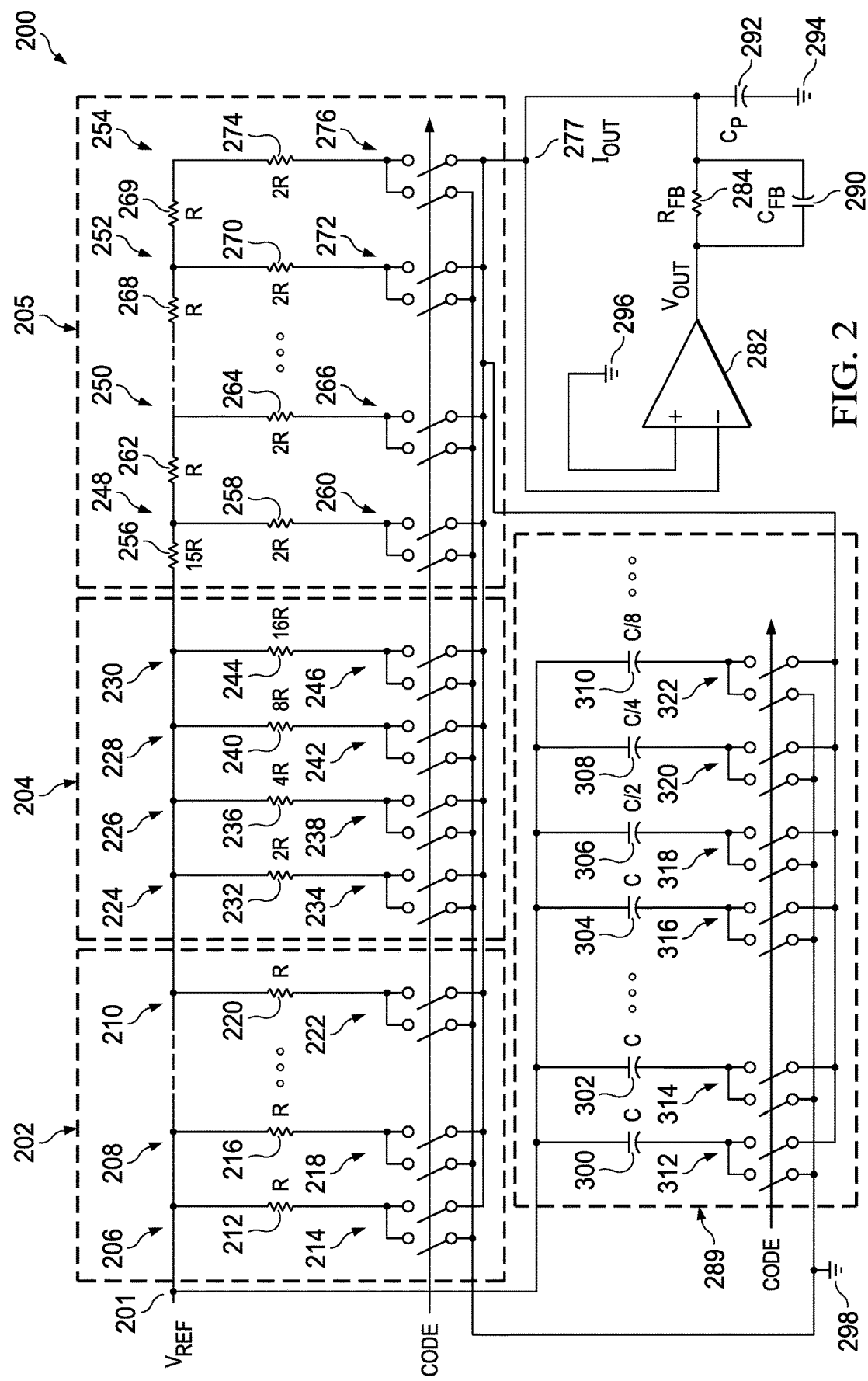
FIG. 2 illustrates a MDAC that includes an array of capacitors scaled in inverse proportion to resistors in the DAC.

Referring to FIG. 2, a diagram of a multiplying DAC (MDAC) 200 with increased multiplying bandwidth is shown. The MDAC 200 includes a thermometric RDAC segment 202, a binary scaled RDAC segment 204, R-2R DAC segment 205, and an array of capacitors 289. In the illustrated example, the MDAC 200 corresponds to an 18 bit DAC configured to receive an 18 bit digital code and to generate an analog signal based on the 18 bit digital code. The thermometric RDAC segment 202 is configured to operate on the four most significant bits of the 18 bit digital code, the R-2R DAC segment 205 is configured to operate on the ten least significant bits of the 18 bit digital code, and the binary scaled RDAC segment 204 is configured to operate on four bits in between the four most significant bits and the 10 least significant bits. The MDAC 200 may be arranged in alternative configurations that operate on digital codes having more or fewer bits. Similarly, each of the segments 202, 204, 205 may operate on a different number of bits than is shown in the illustrated example.

The segments 202, 204, 205 and the capacitor array 289 are connected to a current output node $I_{OUT}$ 277 that is received by a first terminal of an operational amplifier (OPAMP) 282. In the illustrated example, a second terminal of the OPAMP 282 receives ground 296. In other implementations, the second terminal of the OPAMP 282 receives a different direct current potential. Each of the segments 202, 204, 205 includes switches and resistors. The resistors described herein may correspond to fixed resistors or variable resistors. The capacitor array 289 includes capacitors and switches. Each capacitor in the capacitor array 289 corresponds to a resistor in the thermometric RDAC segment 202 or the binary scaled RDAC segment 204. Each capacitor has a capacitance that is inversely scaled based on resistance of the corresponding resistor. While capacitors and resistors are described as having a 1-1 correspondence, it should be noted that any resistor described herein may be replaced with a plurality of resistors and any capacitor described herein may be replaced by a plurality of capacitors. The switches described herein may include mechanical switches, semiconductor devices (e.g., transistors), or a combination thereof. In addition, the R-2R DAC segment 205 may be replaced with a different type of resistor ladder segment (e.g., a string resistor ladder network).

While only four are shown for convenience, the thermometric RDAC segment 202 includes 15 sections (e.g., a section for each decimal value other than zero that can be represented by the 4 most significant bits). Each section of the thermometric RDAC segment 202 includes a resistor, having a resistance R, and 2 switches. One terminal of the resistance is connected to VREF, the other terminal is connected either to $I_{OUT}$ 277 or ground depending on the DAC code. The reference voltage source 201 may correspond to a direct current voltage source or an alternating current voltage source. The $I_{OUT}$ 277 is connected to a first terminal of an operational amplifier 282. The sections of the thermometric RDAC segment 202 are arranged in parallel such that resisters of the sections are connected between the reference voltage source 201 and the $I_{OUT}$ 277 in parallel when the corresponding switches are toggled to connect the reference voltage source 201 to the $I_{OUT}$ 277. Accordingly, in the illustrated example, a conductance of the thermometric RDAC segment 202 varies between 0 and 15/R. FIG. 2 depicts a first section 206 of the thermometric RDAC segment 202, a second section 208 of the thermometric RDAC segment 202, and a third section 210 of the thermometric RDAC segment 202. The first section 206 corresponds to a first digit of a thermometric (e.g., unary) encoding of the four most significant bits of the input digital code, the second section 208 corresponds to a second digit of the thermometric encoding, and the third section 210 corresponds to a fifteenth digit of the thermometric encoding. While not depicted, the thermometric RDAC segment 202 further includes sections corresponding to the third to fourteenth digits of the thermometric encoding. Further, it should be noted that the thermometric RDAC segment may include a different number of sections in implementations in which the thermometric RDAC segment is configured to process a different number of most significant bits of an input digital code (e.g., a number of bits other than four).

The first section 206 of the thermometric RDAC segment 202 includes a first pair of switches 214 and a first resistor 212 connected to a reference voltage. The first pair of switches 214 is configured to toggle one terminal of resistor 212 to either IOUT 277 or ground based on a value of the first digit of the thermometric encoding of the four most significant bits of the input digital code. The second section 208 of the thermometric RDAC segment 202 includes a second resistor 216 and a second pair of switches 218. The second pair of switches 218 is configured to toggle one terminal of resistor 216 to either $I_{OUT}$ 277 or ground based on the second digit of the thermometric encoding. The third section 210 of the thermometric RDAC segment 202 includes a third resistor 220 and a third pair of switches 222. The third pair of switches 222 is configured to toggle one terminal of resistor 220 to either $I_{OUT}$ 277 or ground based on the fifteenth digit of the thermometric encoding. A thermometric encoding of a number N includes N ones (or N zeroes). For example, four bit binary number 0011 (e.g., 3 base ten) may be encoded as 000000000000111 (or 111111111111000). Thus, the thermometric RDAC segment 202 is configured to connect the reference voltage source 201 to the $I_{OUT}$ 277 through a number of resistors equal to a base 10 value of the four most significant bits of the input digital code. In response to the value being 0, the thermometric RDAC segment 202 is configured to couple the corresponding resistor to ground. Because of this thermometric encoding, each section the thermometric RDAC segment 202 has an affect on total resistance at the $I_{OUT}$ 277 based on a position of the section.

The binary scaled RDAC segment 204 includes a first section 224, a second section 226, a third section 228, and a fourth section 230. The first section 224 corresponds to a fifth bit of the input digital code, the second section 226 corresponds to a sixth bit of the input digital code, the third section 228 corresponds to a seventh bit of the input digital code, and the fourth section 230 correspond to an eighth bit of the input digital code. It should be noted that the binary scaled RDAC segment 204 may include a different number of sections in implementations in which the binary scaled RDAC segment 204 is configured to process a different number of bits of an input digital code (e.g., a number of bits other than four).

The first section 224 of the scaled RDAC segment 204 includes a first pair of switches 234 and a first resistor 232 connected to the reference voltage. The first pair of switches 234 is configured to toggle one terminal of the first resistor 232 to either $I_{OUT}$ 277 or ground 296 based on the first bit of the portion of the input digital code processed by the scaled RDAC segment 204. The second section 226 of the binary scaled RDAC segment 204 includes a second pair of switches 238 and a second resistor 236. The second pair of switches 238 is configured to toggle one terminal of the second resistor 236 to either $I_{OUT}$ 277 or ground 296 based on the second bit of the portion of the input digital code processed by the scaled RDAC segment 204. The third section 210 of the scaled RDAC segment 204 includes a third pair of switches 242 and a third resistor 240. The third pair 242 of switches is configured to toggle one terminal of the third resistor 240 to either $I_{OUT}$ 277 or ground 296 based on the third bit of the portion of the input digital code processed by the scaled RDAC segment 204. The fourth section of the scaled RDAC segment 204 includes a fourth pair of switches 246 and a fourth resistor 244. The fourth pair of switches is configured to toggle one terminal of the fourth resistor 244 to either $I_{OUT}$ 277 or ground 296 based on the fourth bit of the portion of the input digital code processed by the scaled RDAC segment 204. The resistors 232, 236, 240, 244 of the binary scaled RDAC segment 204 are binary scaled such that each segment has a resistor with a resistance of $2^x R$, where R is the resistance of the resistors of the thermometric RDAC segment 202 and x is the position of the bit processed by the segment in the portion of bits processed by the scaled RDAC segment 204. In the illustrated example, the first resistor 232 has a resistance of 2R (e.g., $2^1 R$), the second resistor 236 has a resistance of 4R (e.g., $2^2 R$), the third resistor has a resistance of 8R (e.g., $2^3 R$), and the fourth resistor 244 has a resistance of 16R (e.g., $2^4 R$). Because the resistors are binary scaled, an effect of each bit processed by the binary scaled RDAC segment 204 on total resistance at $I_{OUT}$ 277 is weighted based on bit position. Further, because the first section 224 of the binary scaled segment has a resistance (2R) twice the resistance (R) of the resistors of the thermometric RDAC segment 202, an effect of the bits processed by the binary scaled RDAC segment 204 on the total resistance at the $I_{OUT}$ 277 is weighted relative to the bits of the thermometric RDAC segment 202.

The R-2R DAC segment 205 includes eleven sections (e.g., one for each bit of the ten least significant bits of the input digital code processed by the R-2R DAC segment 205 and 1 termination section). For ease of explanation, FIG. 2 depicts four of the eleven sections. These four sections include a first section 248, a second section 250, a third section 252, and a fourth section 254. The first section 248 corresponds to a ninth bit of the input digital code, the second section 250 corresponds to a tenth bit of the input digital code, the third section 252 corresponds to an eighteenth bit of the input digital code, and the fourth section 254 is the termination resistor. While not depicted, the R-2R DAC segment 205 further includes sections corresponding to the eleventh to seventeenth bits. It should be noted that the R-2R DAC segment 205 may include a different number of sections in implementations in which the R-2R DAC segment 205 is configured to process a different number of bits of an input digital code (e.g., a number of bits other than 10).

The first section 248 of the R-2R DAC segment 205 includes a first "rung" resistor 256, a first leg resistor 258, and a first pair of switches 260. The first leg resistor 258 is connected to the reference voltage source 201 in series with the first rung resistor 256 and in parallel with the resistors 212, 216, 220, 232, 236, 240, 244 of the thermometric RDAC segment 202 and the binary scaled RDAC segment 204. The first pair of switches 260 is configured to toggle one terminal of the first leg resistor 258 to either $I_{OUT}$ 277 or ground 296 based on the ninth bit of the input digital code. The first rung resistor 256 is a rescaling resistor and has a resistance equal to $(2^y-1)R$, where y is the number of bits processed by the binary scaled RDAC segment 204. This ensures that input into the R-2R DAC segment 205 has a resistance of $2^y R$. In the illustrated example, the first rung resistor 256 has a resistance of 15R (e.g., $(2^4-1)R$). Accordingly, an effect of the bits processed by the R-2R DAC segment 205 on total resistance at the $I_{OUT}$ 277 is weighted relative to the effects of the bits processed by the binary scaled RDAC segment 204 and the thermometric RDAC segment 202 by the first rung resistor 256 (e.g., the rescaling resistor). The first leg resistor 258 has a resistance of 2R.

The second section 250 of the R-2R DAC segment 205 includes a second rung resistor 262, a second leg resistor 264, and a second pair of switches 266. The second leg resistor 264 is connected to the reference voltage source 201 in series with the first rung resistor 256 and the second rung resistor 262 and in parallel with the first leg resistor 258 and the resistors 212, 216, 220, 232, 236, 240, 244 of the thermometric RDAC segment 202 and the binary scaled RDAC segment 204. The second pair of switches 266 is configured to toggle one terminal of the second leg resistor 264 to either $I_{OUT}$ 277 or ground 296 based on the tenth bit of the input digital code. The second rung resistor 262 has a resistance R and the second leg resistor 264 has a resistance of 2R. The sections of the R-2R DAC segment 205 between the second section 250 and the third section 252 each have a rung resistor, a leg resistor, and a switch arranged as shown with respect to the second section 250.

The third section 252 of the R-2R DAC segment 205 includes a third rung resistor 268, a third leg resistor 270, and a third pair of switches 272. The third leg resistor 270 is connected to the reference voltage source 201 in series with the first rung resistor 256, the second rung resistor 262, the third rung resistor 268, and rung resistors of the sections between the second section 250 and the third section 252 and in parallel with the first leg resistor 258, the second leg resistor 264, and the resistors 212, 216, 220, 232, 236, 240, 244 of the thermometric RDAC segment 202 and the binary scaled RDAC segment 204. The third pair of switches 272 is configured to toggle one terminal of the third leg resistor 270 to either $I_{OUT}$ 277 or ground 296 based on the seventeenth bit of the input digital code. The third rung resistor 262 has a resistance R and the third leg resistor 270 has a resistance of 2R. The sections of the R-2R DAC segment 205 are arranged such that the rung resistors are arranged in series and the leg resistors are in parallel. The series of rung resistors causes an effect of a switch of one of the sections of the R-2R DAC 205 coupling the reference voltage source 201 to the $I_{OUT}$ 277 to be weighted based on a position of the section (e.g., corresponding to a bit position associated with the section).

The fourth section 254 includes a fourth leg resistor 274 and a fourth switch 276. The fourth leg resistor 274 is connected to the reference voltage source 201 in series with the first rung resistor 256, the second rung resistor 262, the third rung resistor 268, and rung resistors of the sections between the second section 250 and the third section 252 and in parallel with the first leg resistor 258, the second leg resistor 264, the third leg resistor 270, and the resistors 212, 216, 220, 232, 236, 240, 244 of the thermometric RDAC segment 202 and the binary scaled RDAC segment 204. In some implementations, the fourth switch 276 is always closed and couples one end of the resistor 274 to ground 296. The fourth switch 276 may be replaced with a direct connection between the resistor 274 and the ground 296. The capacitor array 289 is coupled between the reference voltage source 201 and the $I_{OUT}$ 277 in parallel with the segments 202, 204, 205. The capacitor array 289 includes a first plurality of capacitors corresponding to the thermometric RDAC segment 202 and a second plurality of capacitors corresponding to the scaled RDAC segment 204. Each capacitor of the first plurality is associated with a pair of switches (or other switching configuration, e.g., a single switch) configured to selectively couple the capacitor to a ground 298 or to the $I_{OUT}$ 277 based on a corresponding digit of the thermometric encoding of the four most significant bits of the input digital code. In the illustrated example, a first switch of each pair of switches associated with the first plurality of capacitors is configured to selectively couple the corresponding capacitor to the $I_{OUT}$ 277 based on a corresponding digit of the thermometric encoding and a second switch of the pair is configured to electively couple the corresponding capacitor to the ground 298 based on inverted version of the digit. Each capacitor of the second plurality is associated with a pair of switches (or other switching configuration, e.g., a single switch) configured to selectively connect the capacitor to the ground 298 or to the $I_{OUT}$ 277 based on a corresponding bit of the bits processed by the scaled RDAC segment 204. In the illustrated example, a first switch of each pair of switches associated with the second plurality of capacitors is configured to selectively couple the corresponding capacitor to the $I_{OUT}$ 277 based on a corresponding bit of the input digital code and a second switch of the pair is configured to electively couple the corresponding capacitor to the ground 298 based on inverted version of the bit. Each capacitor of the first plurality of capacitors has a capacitance of C. Each capacitor of the second plurality of capacitors has a capacitance that is inversely scaled based on a resistance scaling of the resistor that corresponds to the capacitor.

The first plurality of capacitors includes a first capacitor 300 corresponding to the first resistor 212 of the thermometric RDAC segment 202, a second capacitor 302 corresponding to the second resistor 216 of the thermometric RDAC segment 202, and a third capacitor 304 corresponding to the third resistor 220 of the thermometric RDAC segment 202.

The first capacitor 300 is connected to a first pair of switches 312 configured to selectively connect the first capacitor 300 to the ground 298 or to the $I_{OUT}$ 277 based on the same digit of the thermometric encoding received by the first switch 214 of the thermometric RDAC segment 202. Thus, the first capacitor 300 and the first resistor 212 of the thermometric RDAC 202 are configured to be selectively coupled to the $I_{OUT}$ 277 responsive to the same condition.

The second capacitor 302 is connected to a second pair of switches 314 configured to selectively connect the second capacitor 302 to the ground 298 or to the $I_{OUT}$ 277 based on the same digit of the thermometric encoding received by the second switch 218 of the thermometric RDAC segment 202. Thus, the second capacitor 302 and the second resistor 216 of the thermometric RDAC 202 are configured to be selectively coupled to the $I_{OUT}$ 277 responsive to the same condition.

The third capacitor 304 is connected to a third pair of switches 316 configured to selectively connect the third capacitor 304 to the ground 298 or to the $I_{OUT}$ 277 based on the same digit of the thermometric encoding received by the third switch 222 of the thermometric RDAC segment 202. Thus, the third capacitor 304 and the third resistor 220 of the thermometric RDAC 202 are configured to be selectively coupled to the $I_{OUT}$ 277 responsive to the same condition.

While not illustrated, the first plurality of capacitors further includes capacitors and pairs of switches corresponding to the unillustrated resistors of the thermometric RDAC segment 202. These unillustrated capacitors are similarly controlled by digits of the thermometric encoding corresponding to resistors of the thermometric RDAC segment 202.

The second plurality of capacitors includes a fourth capacitor 306 corresponding to the first resistor 232 of the scaled RDAC segment 204, a fifth capacitor 308 corresponding to the second resistor 236 of the scaled RDAC segment 204, and a sixth capacitor 310 corresponding to the third resistor 240 of the scaled RDAC segment 204. While not illustrated, the second plurality of capacitors further includes a capacitor corresponding to the fourth resistor 244 of the scaled RDAC segment 204. Each capacitor of the second plurality of capacitors has a capacitance inversely scaled based on a resistance of the corresponding resistor.

The fourth capacitor 306 is connected to a fourth pair of switches 318 configured to selectively connect the fourth capacitor 306 to the ground 298 or to the $I_{OUT}$ 277 based on the same bit of the input digital code received by the first switch 234 of the binary scaled RDAC segment 204. Thus, the fourth capacitor 306 and the first resistor 232 of the binary scaled RDAC segment 204 are configured to be selectively coupled to the $I_{OUT}$ 277 responsive to the same condition. A capacitance of the fourth capacitor 306 is C/2 while a resistance of the first resistor 232 of the binary scaled RDAC segment 204 is 2R. Thus, the fourth capacitor 306 has scaling inverse to scaling of the first resistor 232 of the binary scaled RDAC segment 204.

The fifth capacitor 308 is connected to a fifth pair of switches 320 configured to selectively connect the fifth capacitor 308 to the ground 298 or to the $I_{OUT}$ 277 based on the same bit of the input digital code received by the second switch 238 of the binary scaled RDAC segment 204. Thus, the fifth capacitor 308 and the second resistor 236 of the binary scaled RDAC segment 204 are configured to be selectively coupled to the $I_{OUT}$ 277 responsive to the same condition. A capacitance of the fifth capacitor 308 is C/4 while a resistance of the second resistor 236 of the binary scaled RDAC segment 204 is 4R. Thus, the fifth capacitor 308 has scaling inverse to scaling of the second resistor 236 of the binary scaled RDAC segment 204.

The sixth capacitor 310 is connected to a sixth pair of switches 322 configured to selectively connect the sixth capacitor 310 to the ground 298 or to the $I_{OUT}$ 277 based on the same bit of the input digital code received by the third switch 242 of the binary scaled RDAC segment 204. Thus, the sixth capacitor 310 and the third resistor 240 of the binary scaled RDAC segment 204 are configured to be selectively connected to the $I_{OUT}$ 277 responsive to the same condition. A capacitance of the sixth capacitor 310 is C/8 while a resistance of the third resistor 240 of the binary scaled RDAC segment 204 is 8R. Thus, the sixth capacitor 310 has scaling inverse to scaling of the third resistor 240 of the binary scaled RDAC segment 204.

While not illustrated, the second plurality of capacitors further includes a capacitor and a pair of switches corresponding to the fourth resistor 244 of the binary scaled RDAC segment 204. This capacitor has a capacitance of C/16 while a resistance of the fourth resistor 244 of the binary scaled RDAC segment 204 is 16R. Thus, this unillustrated capacitor has scaling inverse to scaling of the fourth resistor 244 of the binary scaled RDAC segment 204. This unillustrated capacitor is controlled by the bit of the input digital code that controls the fourth switch 246.

In addition, in some implementations, the capacitor array 289 further includes a third set of capacitors corresponding to one or more of the segments of the R-2R DAC 205. Each capacitor in the third set may be selectively coupled to the $I_{OUT}$ 277 by a pair of switches as described above with reference to the first plurality of capacitors and the second plurality of capacitors. Each capacitor in the third set of capacitors may have a suitable capacitance to achieve a flat passband response. A parasitic capacitance 292 of the MDAC 200 is illustrated connected to the ground 294. The parasitic capacitance 292 might be spread among several nodes rather than just to the ground 294. The parasitic capacitance 292 is caused by switches in the segments 202, 204, 205 and may not include a separate dedicated capacitor device. The parasitic capacitance 292 may also be caused by board trace parasitic, OPAMP input capacitance etc.

The OPAMP 282 is configured to receive a sum of current flowing through the $I_{OUT}$ 277 and a feedback current at the first terminal and to receive the ground 296 at a second terminal. The OPAMP 282 is configured to generate a voltage output based on input received at the first and second terminals. An output of the OPAMP 282 is connected to a feedback resistor 284. The $I_{OUT}$ 277 is connected to an output of the feedback resistor 284 so that current at the $I_{OUT}$ 277 and current from the feedback resistor 284 are combined. Accordingly, a feedback loop between an output of the OPAMP 282 and input received at the first terminal is established. A feedback capacitor 290 is coupled across the feedback resistor 284 to decrease a damping factor of the MDAC 200 and flatten a passband response of the MDAC 200. The value of the feedback capacitor is chosen such that $R_{FB}*C_{FB}=R*C$ where R is the thermometric segment resistance and C is the capacitance in capacitor array 289 corresponding to thermometric segment.

In operation, the MDAC 200 receives an input digital code (e.g., an input digital signal) that includes 18 bits. The MDAC 200 converts the four most significant bits to a thermometric representation. For example, the MDAC 200 may include thermometric logic (not shown) that may include hardware, software, or a combination thereof configured to convert a binary number into a thermometric representation. The MDAC 200 applies each digit of the thermometric representation of the four most significant bits to a corresponding one of the switches of the thermometric RDAC segment 202 and a corresponding one of the pairs of switches associated with the first plurality of capacitors. The MDAC 200 further applies each of the next four most significant bits to a corresponding one of the switches of the binary scaled RDAC segment 204 and a corresponding one of the pairs of switches associated with the second plurality of capacitors. Further, the MDAC 200 applies each of the ten least significant bits to a corresponding one of the switches of the R-2R DAC segment 205. The switches of the MDAC 200 connect the reference voltage source 201 or the ground 286 to the $I_{OUT}$ 277 based on the bits received. Accordingly, resistance of the MDAC 200 (and current) at the $I_{OUT}$ 277 and capacitance of the MDAC 200 are set based on the input digital code. As described above, the impact on the resistance at the $I_{OUT}$ 277 of each bit is weighted based on the structures of the different DAC segments 202, 204, 205. Accordingly, a current generated at the $I_{OUT}$ 277 is based on the input code. The OPAMP 282 generates an output voltage based on the current and a feedback current through the feedback resistor 284 received at the first terminal and based on the ground 296 received at the second terminal.

Because each resistor of the thermometric RDAC segment 202 and the binary scaled RDAC segment 204 is tied to a corresponding inversely scaled capacitor, capacitance of the MDAC 200 may be approximated by the equation $$C_{DAC} = C_{FB}\frac{code}{2^N},$$

where $C_{DAC}$ is the capacitance of the MDAC 200, $C_{FB}$ is a capacitance of the feedback capacitor 290, code is the input digital code, and N is a number of bits in in the input digital code. Resistance of the MDAC 200 may be approximated as $$R_{DAC} = R_{FB}\frac{2^N}{code},$$

where $R_{DAC}$ is the resistance of the MDAC 200 and $R_{FB}$ is the resistance of the feedback resistor 284. Accordingly, $R_{DAC}C_{DAC}=R_{FB}C_{FB}$. Therefore, a Laplace transfer function of the MDAC 200 at full code is $$\frac{V_{OUT}}{V_{REF}} = \frac{-(1+sR_{FB}C_{FB})}{\frac{s^2 R_{FB}C_{FB}}{\omega_{UGB}}\left(2+\frac{C_P}{C_{FB}}\right)+s\left(\frac{2}{\omega_{UGB}}+R_{FB}C_{FB}\right)+1},$$

where $V_{OUT}$ is an output voltage of the OPAMP 282, $V_{REF}$ is a reference voltage of the reference voltage source 201, $\omega_{UGB}$ is a unity gain bandwidth of the OPAMP 282 in rad/s, and s is the Laplace transform complex frequency. Assuming that $$R_{FB}C_{FB} \gg \frac{1}{\omega_{UGB}}+\left(2+\frac{C_P}{C_{FB}}\right),$$

the second order transfer function may be simplified to a first order transfer function $$\frac{V_{OUT}}{V_{REF}} \sim \frac{-1}{1+\frac{s}{\omega_{UGB}}\left(2+\frac{C_P}{C_{FB}}\right)}.$$

Accordingly, the multiplying bandwidth of the MDAC 200 is approximately 2 times higher than the multiplying bandwidth of MDAC 100 for same MDAC and OPAMP parameters $R_{FB}$, Cp and $\omega_{UGB}$. Also the multiplying bandwidth of the MDAC 200 may be independent of $R_{FB}$. Therefore, multiplying bandwidth of the MDAC 200 may be increased without increasing power dissipation of the MDAC 200.

It should be noted that MDAC 200 may be implemented in alternative configurations. For example, the MDAC 200 may be configured to convert input digital code that includes more than 18 bits. In such examples, the segments 202, 204, 205 may include additional resistors and the capacitor array 289 may include additional capacitors. Further, as described above, resistors described herein may be replaced by multiple resistors and capacitors described herein may be replaced by multiple capacitors. In addition, some or all of the pairs of switches illustrated in FIG. 2 may be replaced by single switches.

Further, in some examples, the R-2R DAC segment 205 is replaced by an R-2R DAC segment that does not include a rescaling resistor. Such an R-2R DAC segment may include rung resistors that have resistances equal to one half a resistance of a resistor in the binary scaled RDAC segment 204 associated with a least significant bit processed by the binary scaled RDAC segment 204 (e.g., the fourth resistor 244). Further, such an R-2R DAC segment may include leg resistors that have resistances equal to twice the resistance of the resistor in the binary scaled RDAC segment 204 associated with the least significant bit processed by the binary scaled RDAC segment 204. In some examples, the MDAC 200 may not include the R-2R DAC segment 205. In some examples, the MDAC 200 may not include one of the thermometric RDAC segment 202 and the binary scaled RDAC segment 204. Aspects of these alternative examples may be combined. For example, an example MDAC may include the binary scaled RDAC segment 204 and the capacitor array 289 but not the thermometric RDAC segment 202 or the R-2R DAC segment 205.

Further, as described above, in some examples, the capacitor array 289 includes one or more capacitors corresponding to segments of the R-2R DAC 205. Each of these capacitors may be inversely scaled based on total resistance of a corresponding segment of the R-2R DAC segment 205. A capacitor corresponds responsive to a bit of an input digital code corresponds to a DAC segment that is responsive to the same bit.

"The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A."

What is claimed is:

1. A multiplying digital to analog converter (MDAC) comprising:
   a first resistor having a first resistance;
   a first pair of switches configured to selectively connect or disconnect the first resistor to a current output or ground determined by a first bit of a portion of an input digital code;
   a second resistor having a second resistance that is scaled with respect to the first resistance by a factor N where N is an integer;
   a second pair of switches configured to selectively connect or disconnect the second resistor to the current output or ground determined by a second bit of the portion of the input digital code;
   a first capacitor having a first capacitance;
   a third pair of switches configured to selectively connect or disconnect the first capacitor to the current output or ground determined by the first bit of the portion of the input digital code;
   a second capacitor having a second capacitance that is scaled with respect to the first capacitance by 1/N; and
   a fourth pair of switches configured to selectively connect or disconnect the second capacitor to the current output or ground determined by the second bit of the portion of the input digital code.

2. The MDAC of claim 1, wherein:
   the first pair of switches is configured to connect the first resistor to the current output in response to the first bit having a first binary value;
   the third pair of switches is configured to connect the first capacitor to the current output in response to the first bit having the first binary value;
   the second pair of switches is configured to connect the second resistor to the current output in response to the second bit having a second binary value; and
   the fourth pair of switches is configured to connect the second capacitor to the current output in response to the second bit having the second binary value.

3. The MDAC of claim 1, further comprising:
   a third resistor having a third resistance, wherein the first resistance is scaled with respect to the third resistance by N;
   a fifth switch configured to connect the third resistor to the current output determined by a first digit of a thermometric encoding of a second portion of the input digital code;
   a fourth resistor having the third resistance;
   a sixth pair of switches configured to connect the fourth resistor to the current output determined by on a second digit of the thermometric encoding;
   a third capacitor having a third capacitance, wherein the first capacitance is scaled with respect to the third resistance by 1/N;
   a seventh pair of switches configured to connect the third capacitor to the current output determined by the first digit of the thermometric encoding;
   a fourth capacitor having the third capacitance; and
   an eighth pair of switches configured to connect the fourth capacitor to the current output determined by the second digit of the thermometric encoding.

4. The MDAC of claim 1, further comprising a plurality of resistors arranged in an R-2R resistor ladder.

5. The MDAC of claim 4, further comprising a fifth capacitor configured to be selectively coupled to the current output and having a fifth capacitance scaled based on a resistance of a resistor segment of the R-2R resistor ladder.

6. The MDAC of claim 1, wherein a first switch of the third pair of switches is configured to connect the first capacitor to the current output determined by the first bit and a second switch of the third pair of switches is configured to connect the first capacitor to ground determined by a binary compliment of the first bit.

7. The MDAC of claim 1, further comprising:
   an operational amplifier (OPAMP), the operational amplifier including a first terminal connected to the current output and a second terminal connected to a direct current voltage; and
   a feedback resistor connected to an output of the OPAMP and to the first terminal of the OPAMP.

8. The MDAC of claim 7, further comprising a feedback capacitor coupled across the feedback resistor.

9. The MDAC of claim 1, wherein the first resistor, the second resistor, the first capacitor, and the second capacitor are connected to a reference voltage source in parallel.

10. A multiplying digital to analog converter (MDAC) comprising:
a plurality of resistors including:
a first resistor configured to be selectively connected to a current output determined by a first bit of a first portion of an input digital code; and
a second resistor configured to be selectively connected to the current output determined by a second bit of the first portion of the input digital code, wherein a resistance of the second resistor is twice a resistance of the first resistor; and
a plurality of capacitors including:
a first capacitor configured to be selectively connected to the current output determined by the first bit of the first portion; and
a second capacitor configured to be selectively connected to the current output determined by the second bit of the first portion, wherein a capacitance of the second capacitor is one half a capacitance of the first capacitor.

11. The MDAC of claim 10, further comprising:
a second plurality of resistors including:
a third resistor configured to be connected to the current output determined by a first digit of a thermometric encoding of a second portion of the input digital code, wherein the third resistor has a resistance one half the resistance of the first resistor; and
a fourth resistor configured to be connected to the current output determined by a second digit of the thermometric encoding, wherein the fourth resistor has a resistance one half the resistance of the first resistor; and
a second plurality of capacitors including:
a third capacitor configured to be connected to the current output determined by the first digit of the thermometric encoding, wherein the third capacitor has a capacitance twice the capacitance of the capacitance of the first capacitor; and
a fourth capacitor having the third capacitance configured to be connected to the current output determined by the second digit of the thermometric encoding, wherein the fourth capacitor has a capacitance twice the capacitance of the capacitance of the first capacitor.

12. The MDAC of claim 11, wherein the second portion corresponds to a number of most significant bits of the input digital code.

13. The MDAC of claim 11, further comprising a third plurality of resistors arranged in an R-2R resistor ladder.

14. The MDAC of claim 10, further comprising an operational amplifier (OPAMP), the operational amplifier including a first terminal connected to the current output and a second terminal connected to ground.

15. The MDAC of claim 14, further comprising a feedback resistor connected to an output of the OPAMP and to the first terminal of the OPAMP.

16. The MDAC of claim 15, further comprising a feedback capacitor coupled across the feedback resistor.

17. The MDAC of claim 10, wherein the first resistor, the second resistor, the first capacitor, and the second capacitor are connected to a reference voltage source in parallel.

18. A multiplying digital to analog converter (MDAC) comprising:
a first resistor having a first resistance;
a first pair of switches configured to selectively connect or disconnect the first resistor to a current output or ground determined by a digit of a thermometric encoding of a portion of an input digital code;
a second resistor having a second resistance that is scaled with respect to the first resistance by a factor N where N is an integer;
a second pair of switches configured to selectively connect or disconnect the second resistor to the current output or ground determined by a bit of a second portion of the input digital code;
a first capacitor having a first capacitance;
a third pair of switches configured to selectively connect or disconnect the first capacitor to the current output or ground determined by the digit of the thermometric encoding;
a second capacitor having a second capacitance that is scaled with respect to the first capacitance by 1/N; and
a fourth pair of switches configured to selectively connect or disconnect the second capacitor to the current output or ground determined by the bit of the second portion of the input digital code.

19. The MDAC of claim 18, further comprising an operational amplifier (OPAMP), the operational amplifier including a first terminal connected to the current output and a second terminal connected to ground.

20. The MDAC of claim 19, further comprising:
a feedback resistor connected to an output of the OPAMP and to the first terminal of the OPAMP; and
a feedback capacitor coupled across the feedback resistor.

* * * * *